(12) United States Patent
Derckx et al.

(10) Patent No.: US 11,954,283 B2
(45) Date of Patent: Apr. 9, 2024

(54) HIGH RESOLUTION TOUCH SENSOR APPARATUS AND METHOD

(71) Applicant: Touch Biometrix Limited, St Asaph (GB)

(72) Inventors: Henricus Derckx, St Asaph (GB); Wilhelmus Van Lier, St Asaph (GB); Michael A Cowin, St Asaph (GB)

(73) Assignee: TOUCH BIOMETRIX LIMITED, St. Asaph (GB)

( * ) Notice: Subject to any disclaimer, the term of this patent is extended or adjusted under 35 U.S.C. 154(b) by 0 days.

(21) Appl. No.: 17/436,150

(22) PCT Filed: Mar. 9, 2020

(86) PCT No.: PCT/GB2020/050560
§ 371 (c)(1),
(2) Date: Sep. 3, 2021

(87) PCT Pub. No.: WO2020/178605
PCT Pub. Date: Sep. 10, 2020

(65) Prior Publication Data
US 2022/0129132 A1    Apr. 28, 2022

(30) Foreign Application Priority Data

Mar. 7, 2019 (GB) ..................... 1903093

(51) Int. Cl.
*G06F 3/041* (2006.01)
*G06F 3/044* (2006.01)
*H03K 17/96* (2006.01)

(52) U.S. Cl.
CPC .......... *G06F 3/04164* (2019.05); *G06F 3/044* (2013.01); *H03K 17/962* (2013.01)

(58) Field of Classification Search
None
See application file for complete search history.

(56) References Cited

U.S. PATENT DOCUMENTS

| | | | |
|---|---|---|---|
| 2005/0062485 A1* | 3/2005 | Hara | G06V 40/1306 324/661 |
| 2006/0076963 A1 | 4/2006 | Miyasaka | |
| 2006/0097735 A1 | 5/2006 | Ebihara | |
| 2009/0273580 A1* | 11/2009 | Ota | G06F 3/042 345/175 |
| 2014/0266262 A1 | 9/2014 | Taghibakhsh | |
| 2017/0006245 A1 | 1/2017 | Akhavan Fomani et al. | |

(Continued)

FOREIGN PATENT DOCUMENTS

TW        201419097       5/2014

OTHER PUBLICATIONS

International Search Report dated May 19, 2020 in PCT/GB2020/050560.

(Continued)

*Primary Examiner* — Christopher R Lamb
(74) *Attorney, Agent, or Firm* — Barnes & Thornburg LLP

(57) ABSTRACT

A sensor array (10) comprising a plurality of touch sensitive pixels, each pixel (12) comprising a capacitive sensing electrode (14) and a reference capacitor (16) connected in series with the capacitive sensing electrode (14) to provide an indicator voltage that is indicative of the proximity of a conductive object to be sensed.

10 Claims, 5 Drawing Sheets

(56) References Cited

U.S. PATENT DOCUMENTS

| | | | |
|---|---|---|---|
| 2017/0162121 A1* | 6/2017 | Yang | G06F 3/007 |
| 2017/0351364 A1 | 12/2017 | Kim et al. | |
| 2018/0113531 A1* | 4/2018 | Na | G06F 3/0412 |
| 2019/0204954 A1* | 7/2019 | Kim | G06F 3/0443 |

OTHER PUBLICATIONS

Written Opinion Report dated May 19, 2020 in PCT/GB2020/050560.

Tiao et al., "A CMOS Readout Circuit for LTPS-TFT Capacitive Fingerprint Sensor," IEEE Journal, pp. 631-634, 2005.

Kang et al., "Capacitive sensor pixel circuit with single transistor for touch-fingerprint recognition sensor," Electronic Letters, vol. 54, No. 21, pp. 1212-1214, Oct. 18, 2018.

Huang et al., "Design and Modeling of 1000ppi Fingerprint Sensor," IEEE Journal, 3 pages, 2015.

Jeon et al., "Capacitive Sensor Array for Fingerprint Recognition," 2016 Tenth International Conference on Sensing Technology, 4 pages, 2016.

Hara et al., "Low Temperature Polycrystalline Silicon TFT Fingerprint Sensor with Integrated Comparator Circuit," IEEE Journal, pp. 403-406, 2004.

Chen et al., "Integrated Active-Matrix Capacitive Sensor Using a-IGZO TFTs for AMOLED," Journal of the Electron Devices Society, vol. 6, pp. 214-218, 2018.

\* cited by examiner

HIGH RESOLUTION TOUCH SENSOR APPARATUS AND METHOD

CROSS-REFERENCE TO RELATED APPLICATIONS

This application claims priority under 35 USC § 371 of PCT Application No. PCT/GB2020/050560 filed on Mar. 9, 2020, which claimed priority from United Kingdom Patent Application No. GB 1903093.1, filed on Mar. 7, 2019, the entirety of each are hereby fully incorporated by reference herein.

FIELD OF INVENTION

The present invention relates to apparatus and methods, and more particularly to touch sensitive surfaces, methods for control and signal acquisition from such surfaces, and methods of manufacturing such surfaces.

BACKGROUND

Secure, verifiable authentication, of user identity is an increasingly important part of all technology. To give just a few examples, it plays a part in:
- user equipment (UE) used for communication and consumer access to media content,
- computer devices and systems which store and provide access to sensitive data,
- devices and systems used for financial transactions, access control for buildings, and
- access control for vehicles.

Biometric measurement of the user is now prevalent in all of these contexts and others. Biometric measures such as iris scanning, and facial recognition are dependent on lighting and field of view of a camera. It may also be possible to circumvent such security measures by presenting a video or photo of the user to the camera.

Fingerprint sensors have been thought of as being more secure, but it is possible also to overcome the security they provide, and the manufacturing requirements of such sensors makes it difficult to integrate them into other electronic devices such as mobile telephones and other UEs. In particular, fingerprint sensing demands very high resolution—at least hundreds of pixels per inch.

One example of such a sensor is Apple Inc's Touch ID®. This sensor is based on a laser-cut sapphire crystal. It uses a detection ring around the sensor to detect the presence of the user's finger. The Touch ID® sensor uses capacitive touch sensing to detect the fingerprint, and has a 500 pixel per inch (PPI) resolution.

Capacitance sensors such as these use capacitive effects associated with the surface contours of the fingerprint. The sensor array pixels each include an electrode which acts as one plate of a capacitor, the dermal layer (which is electrically conductive) acts as the other plate, and the non-conductive epidermal layer acts as a dielectric. The capacitance is greater where the dermis is closer to the pixel electrode, and so the surface contours of the skin can be sensed by measuring the capacitance of each pixel (e.g. based on the charge accumulated on the pixel electrode) and assembling an image from those pixels.

Both passive matrix and active matrix capacitive touch sensors have been proposed. Most so-called passive capacitive touch sensing systems use an external driving circuit (such as an integrated circuit, IC) to drive a matrix of passive electrodes, and a separate readout circuit (e.g. an IC) to readout charge stored on these electrodes during the drive cycle. The stored charge varies dependent on the tiny capacitance changes due to touch events. Passive electrode systems are sensitive to environmental noise and interference.

Active matrix capacitive touch sensors include a switching element in each pixel. The switching element may control a conduction path between the capacitive sensing electrode in the pixel, and an input channel to an analogue to digital converter (ADC) in a read-out circuit. Typically each column of pixels in an active array is connected to one such input channel. The charge stored in the array can thus be read from the active matrix by controlling the switching elements to connect each row of pixels, one-by-one, to the ADC.

Each pixel needs to be connected to the read-out circuit, and all of the pixels of each column are effectively connected in parallel. The parasitic capacitance associated with each pixel therefore combines additively. This places an inherent limit on the number of pixels that can be combined together in any one column. This in turn limits the size and/or resolution of a capacitive touch sensor.

There thus remains a significant unmet commercial need for large area high resolution touch sensors.

SUMMARY

Aspects and examples of the invention are set out in the claims and aim to address at least a part of the above described technical problem, and other problems.

In an aspect there is provided a sensor array comprising a plurality of touch sensitive pixels, each pixel comprising: a capacitive sensing electrode for accumulating a charge in response to proximity of a conductive object to be sensed; a reference capacitor connected in series with the capacitive sensing electrode so that, in response to a control voltage, an indicator voltage is provided at the connection (18) between the reference capacitor and the capacitive sensing electrode to indicate the proximity of the conductive object to be sensed. This arrangement may reduce or overcome the problem associated with parasitic capacitance which may occur in prior art touch sensors.

Each pixel may comprise a sense VCI (voltage controlled impedance) having a control terminal connected so that the impedance of the sense VCI is controlled by the indicator voltage. Typically the sense VCI comprises at least one TFT (thin film transistor) and the conduction path of the VCI comprises the channel of the TFT. A conduction path of the sense VCI may be connected to a first plate of the reference capacitor (16), and the control terminal of the first VCI is connected to the second plate of the reference capacitor. At least one plate of the reference capacitor may be provided by a metallisation layer of a thin film structure which provides the sense VCI.

The conduction path of the sense VCI may connect the first plate of the reference capacitor, and so also the control voltage, to an input of a readout circuit. This may enable the circuitry which provides the control voltage also to provide the basis for the output signal of the pixel. This may further address problems associated with parasitic capacitance and signal to noise ratio in prior art touch sensors. An alternative way to address this same problem is to arrange the conduction path of the sense VCI to connect a reference signal supply to an input of a readout circuit. The reference signal supply may comprise a constant voltage current source.

Thus, modulating the impedance of the sense VCI of a pixel controls the current from that pixel to the input of the read-out circuit.

A select VCI may also be included in each pixel. This may be connected so that its conduction path is connected in series between the conduction path of the sense VCI and the reference signal supply. Thus, switching the select VCI into a non-conducting state can isolate the sense VCI from the reference signal input, whereas switching the select VCI into a conducting state can enable current to flow through the pixel (depending on the impedance of the sense VCI). A control terminal of the select VCI may be connected for receiving the control voltage, e.g. from a gate drive circuit.

Each pixel may comprise a reset circuit for setting the control terminal (22) of the sense VCI to a selected reset voltage. The reset circuit may comprise a reset VCI. A conduction path of the reset VCI is connected between a second plate of the reference capacitor and one of (a) a reset voltage; and (b) a first plate of the reference capacitor. A control terminal (32) of the reset VCI may be connected to another pixel of the sensor for receiving a reset signal (e.g. from a channel of a gate drive circuit which is connected to the control terminal of the select VCI of a pixel in another row of the array). The reset signal may be configured to switch the reset VCI into a conducting state, thereby to connect the second plate of the reference capacitor to the one of (a) the reset voltage and (b) the first plate of the capacitor. Connecting the second plate of the reference capacitor to the one of (a) the reset voltage.

Each pixel may comprise a gate line VCI, and a conduction path of the gate line VCI may connect the reference signal supply to the first plate of the reference capacitor for providing the control voltage.

An aspect also provides a method of operating a sensor array comprising a plurality of touch sensitive pixels, the method comprising: applying a control voltage to a reference capacitor of a pixel of the sensor to charge the reference capacitor and a capacitive sensing electrode, wherein the reference capacitor and the capacitive sensing electrode together provide, in response to the control voltage, an indicator voltage indicative of the proximity of a conductive object to be sensed by the pixel.

The indicator voltage may be used to control the impedance of a conduction path of a sense VCI connected to an input channel of a readout circuit. The control voltage may be provided by an output channel of a gate drive circuit, and the output channel of the gate drive circuit may be connected to the input channel of the readout circuit via the conduction path of the sense VCI. The method may comprise operating the sense VCI to modulate the impedance of a conduction path between the output channel of the gate drive circuit and the input channel of the readout circuit. This may help to address problems associated with parasitic capacitance from other pixels in the same column from swamping signal from the active pixel. An alternative way to address this same technical problem is provided when a reference signal supply is connected to the input channel of the readout circuit by the conduction path of the sense VCI. In these embodiments, the method may comprise operating the sense VCI to modulate the impedance of a conduction path between the reference signal supply and the input channel of the readout circuit.

The method may comprise operating a gate line VCI to provide the control voltage by connecting the reference signal supply to the reference capacitor via a conduction path of the gate line VCI.

The method may comprise resetting the reference capacitor prior to a subsequent application of the control voltage. Resetting the reference capacitor may comprise operating a reset circuit using a control voltage which is also applied to another pixel of the sensor array—for example a control voltage which is used to activate another row of pixels of the array.

Resetting the reference capacitor may comprise operating a reset VCI to connect a first plate of the reference capacitor to one of: (a) a reset voltage; and (b) a second plate of the reference capacitor. Resetting the reference capacitor may comprise connecting the first and second plates of the reference capacitor to each other.

An aspect also provides an individual pixel comprising: a capacitive sensing electrode for accumulating a charge in response to proximity of a conductive object to be sensed; a reference capacitor connected in series with the capacitive sensing electrode so that, in response to a control voltage, an indicator voltage is provided at the connection (18) between the reference capacitor and the capacitive sensing electrode to indicate the proximity of the conductive object to be sensed. Embodiments may provide a group of such pixels, such as may provide a component part of such an array.

For the avoidance of doubt, the disclosure of this application is intended to be considered as a whole. Any feature of any one of the examples disclosed herein may be combined with any selected features of any of the other examples described herein.

For example, features of methods may be implemented in suitably configured hardware, and the functionality of the specific hardware described herein may be employed in methods which may implement that same functionality using other hardware.

BRIEF DESCRIPTION OF DRAWINGS

Some practical implementations will now be described, by way of example only, with reference to the accompanying drawings in which.

In the drawings like reference numerals are used to indicate like elements.

SPECIFIC DESCRIPTION

Figure 1:
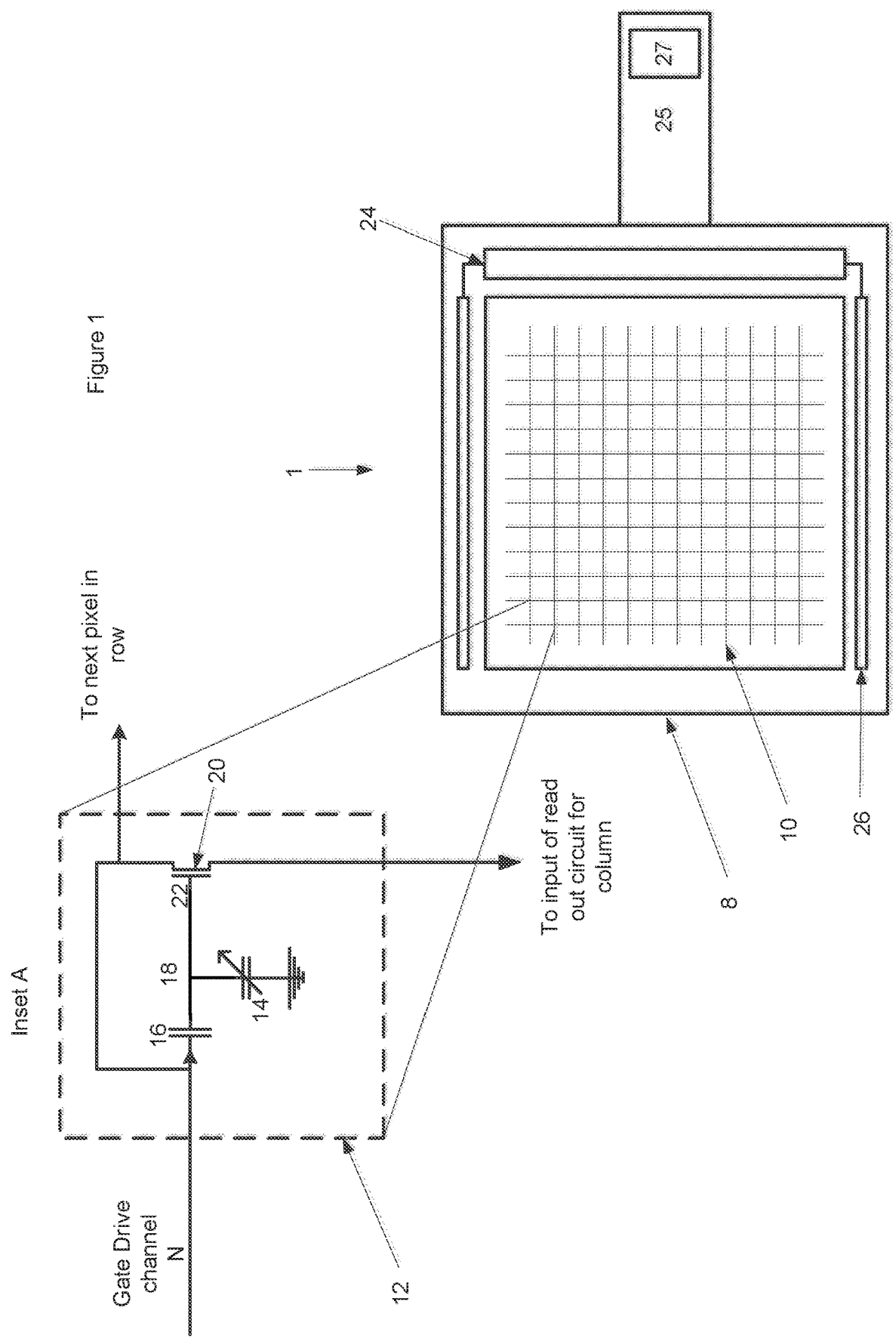
FIG. 1 comprises a plan view of a sensor apparatus comprising a sensor array, and Inset A of FIG. 1 shows a circuit diagram for a pixel of the sensor array.
Figure 2:
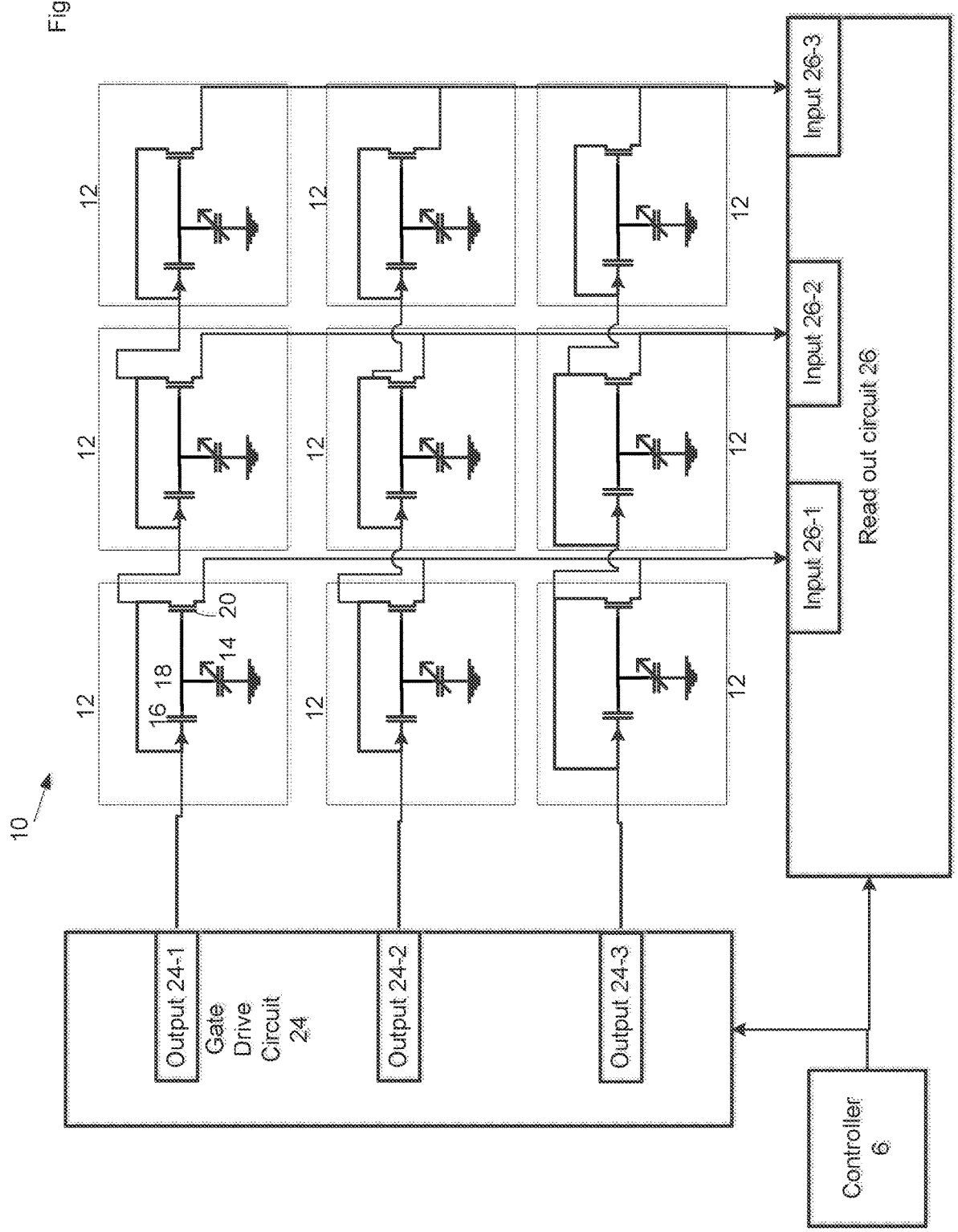
FIG. 2 shows a circuit diagram of a sensor array for a sensor apparatus such as that illustrated in FIG. 1.

FIG. 1 shows a sensor apparatus 1 in which the sensor array 10 of the present disclosure may be incorporated. FIG. 2 illustrates a circuit diagram of one such sensor array 10. The description which follows shall refer to FIG. 1 and FIG. 2 together. It can be seen from an inspection of FIG. 1 and FIG. 2 that inset A of FIG. 1 shows a detailed view of one pixel of this array 10.

The sensor array 10 comprises a plurality of touch sensitive pixels 12. Typically, other than in respect of its position in the array, each pixel 12 is identical to the others in the array 10. As illustrated, each pixel 12 comprises a capacitive sensing electrode 14 for accumulating a charge in response to proximity of the surface of a conductive object to be sensed. A reference capacitor 16 is connected between the capacitive sensing electrode 14 and a connection to a gate drive channel 24-1 of a gate drive circuit 24. Thus, a first plate of the reference capacitor 16 is connected to the gate drive channel 24-1, and a second plate of the reference capacitor 16 is connected to the capacitive sensing electrode 14.

Each pixel 12 may also comprise a sense VCI (voltage controlled impedance) 20 having a conduction path, and a control terminal (22; inset A, FIG. 1) for controlling the impedance of the conduction path. The conduction path of the sense VCI 20 may connect the gate drive channel 24-1 to an output of the pixel 12. The control terminal 22 of the VCI is connected to the capacitive sensing electrode 14 and to the second plate of the reference capacitor 16. Thus, in response to a control voltage applied by the gate drive channel 24-1, the reference capacitor 16 and the capacitive sensing electrode 14 act as a capacitive potential divider.

The capacitance of the capacitive sensing electrode 14 depends on the proximity, to the capacitive sensing electrode 14, of a conductive surface of an object to be sensed. Thus, when a control voltage is applied to the first plate of the reference capacitor 16, the relative division of that voltage between that sensing electrode 14 and the reference capacitor 16 provides an indication of the proximity of the surface of that conductive object to the capacitive sensing electrode 14. This division of the control voltage provides an indicator voltage at the connection 18 between the reference capacitor 16 and the capacitive sensing electrode 14. This indicator voltage can be applied to the control terminal 22 of the sense VCI 20 to provide an output from the pixel 12 which indicates proximity of the conductive object.

Pixels may be positioned sufficiently close together so as to be able to resolve contours of the skin such as those associated with epidermal ridges, for example those present in a fingerprint, palmprint or other identifying surface of the body. It will be appreciated in the context of the present disclosure that contours of the skin may comprise ridges, and valleys between those ridges. During touch sensing, the ridges may be relatively closer to a sensing electrode than the "valleys" between those ridges. Accordingly, the capacitance of a sensing electrode adjacent a ridge will be higher than that of a sensing electrode which is adjacent a valley. The description which follows explains how systems can be provided in which sensors of sufficiently high resolution to perform fingerprint and other biometric touch sensing may be provided over larger areas than has previously been possible.

As shown in FIG. 1 and FIG. 2 in addition to the sensor array 10, such a sensor may also comprise a dielectric shield 8, a gate drive circuit 24, and a read out circuit 26. A connector 25 for connection to a host device may also be included. This may be provided by a multi-channel connector having a plurality of conductive lines. This may be flexible, and may comprise a connector such as a flexi, or flexi-rigid PCB, a ribbon cable or similar. The connector 25 may carry a host interface 27, such as a plug or socket, for connecting the conductive lines in the connector to signal channels of a host device in which the sensor apparatus 1 is to be included.

The host interface 27 is connected by the connector 25 to the read-out circuit 26. A controller (6; FIG. 2) may be connected to the gate drive circuit 24 for operating the sensor array, and to the read-out circuit 26 for obtaining signals indicative of the self-capacitance of pixels of the sensor array 10.

The dielectric shield 8 is generally in the form of a sheet of an insulating material which may be transparent and flexible such as a polymer or glass. The dielectric shield 8 may be flexible, and may be curved. An 'active area' of this shield overlies the sensor array 10. In some embodiments, the VCIs and other pixel components are carried on a separate substrate, and the shield 8 overlies these components on their substrate. In other embodiments the shield 8 provides the substrate for these components.

The sensor array 10 may take any one of the variety of forms discussed herein. Different pixel designs may be used, typically however the pixels 12 comprise at least a capacitive sensing electrode 14, a reference capacitor 16, and at least a sense VCI 20.

The array illustrated in FIG. 2 comprises a plurality of rows of pixels such as those illustrated in FIG. 1. Also shown in FIG. 2 is the gate drive circuit 24, the read out circuit 26, and a controller 6. The controller 6 is configured to provide a clock signal, e.g. a periodic trigger, to the gate drive circuit 24, and to the read-out circuit 26.

The gate drive circuit 24 comprises a plurality of gate drive channels 24-1, 24-2, 24-3, which it is operable to control separately, e.g. independently. Each such gate drive channel 24-1, 24-2, 24-3 comprises a voltage source arranged to provide a control voltage output. And each channel 24-1 is connected to a corresponding row of pixels 12 of the sensor array 10. In the arrangement shown in FIG. 2 each gate drive channel 24-1, 24-2, 24-3 is connected to the first plate of the reference capacitor 16 in each pixel 12 of its row of the sensor array 10. During each clock cycle, the gate drive circuit 24 is configured to activate one of the gate drive channels 24-1, 24-2, 24-3 by applying a gate drive pulse to those pixels. Thus, over a series of cycles the channels (and hence the rows) are activated in sequence, and move from one step in this sequence to the next in response to the clock cycle from the controller 6.

The read-out circuit 26 comprises a plurality of input channels 26-1, 26-2, 26-3. Each input channel 26-1, 26-2, 26-3 is connected to a corresponding column of pixels 12 in the sensor array 10. To provide these connections, the conduction path of the sense VCI 20 in each pixel 12 is connected to the input channel 26-1 for the column.

Each input channel 26-1, 26-2, 26-3 of the read out circuit 26 may comprise an analogue front end (AFE) and an analogue-to-digital converter (ADC) for obtaining a digital signal from the column connected to that input channel 26-1. For example it may integrate the current applied to the input channel during the gate pulse to provide a measure of the current passed through the sense VCI 20 of the active pixel 12 in that column. The read out circuit 26 may convert this signal to digital data using the ADC. Furthermore, the analogue front end performs impedance matching, signal filtering and other signal conditioning and may also provide a virtual reference.

In the sensor array 10 shown in FIG. 2, the conduction channel of the sense VCI 20 in each pixel connects the input channel of the read out circuit for that column to the gate drive channel for the pixel's row. In FIG. 2, the gate drive channel for the row thus provides a reference input. Operation of the sense VCI 20 modulates this reference input to provide the pixel output. This output signal from a pixel indicates the charge stored on the capacitive sensing electrode 14 in response to that reference input relative to that stored on the reference capacitor.

FIG. 1 includes a grid as a very schematic illustration of the rows and columns of pixels 12 which make up the array. Typically this will be a rectilinear grid, and typically the rows and columns will be evenly spaced. For example the pixels may be square. It will of course be appreciated that the grid shown in FIG. 1 is not to scale. Typically the sensor array has a pixel spacing of at least 200 dots per inch, dpi (78 dots per cm). The pixel spacing may be at least 300 dpi (118 dots per cm), for example at least 500 dpi (196 dots per cm).

Operation of the sensor array 10 of FIG. 2 will now be described.

On each cycle of operation, the gate drive circuit 24 and the read out circuit 26 each receive a clock signal from the controller 6.

In response to this clock signal, the gate drive circuit operates one of the gate drive channels to apply a control voltage to one of the rows of the array. In each pixel in the row, the control voltage from the gate drive channel is applied to the series connection of the reference capacitor 16 and the capacitive sensing electrode 14. The voltage at the connection 18 between the two provides an indicator voltage indicating the proximity of a conductive surface of an object to be sensed to the capacitive sensing electrode 14. This indicator voltage may be applied to the control terminal of the sense VCI 20 to control the impedance of the conduction path of the sense VCI 20. A current is thus provided through the conduction path of the sense VCI 20 from the gate drive to the input channel for the pixel's column. This current is determined by the gate drive voltage, and by the impedance of the conduction channel.

In response to the same clock signal, the read-out circuit 26 senses the pixel output signal at each input channel. This may be done by integrating the current received at each input of the read-out circuit 26 over the time period of the gate pulse. The signal at each input channel, such as a voltage obtained by integrating the current from the corresponding column of the array, may be digitised (e.g. using an ADC). Thus, for each gate pulse, the read-out circuit 26 obtains a set of digital signals, each signal corresponding to a column of the active row during that gate pulse. So the set of signals together represent the active row as a whole, and the output from each pixel being indicative of the charge stored on and/or the self-capacitance of the capacitive sensing electrode 14 in that pixel.

Following this same process, each of the gate-drive channels is activated in sequence. This drives the sense VCI 20 of each pixel connected to that channel into a conducting state for a selected time (typically the duration of one gate pulse). By activating the rows of the array in sequence the read out circuit, can scan the sensor array row-wise. Other pixel designs, other scan sequences, and other types of sensor array, may be used.

Figure 3:
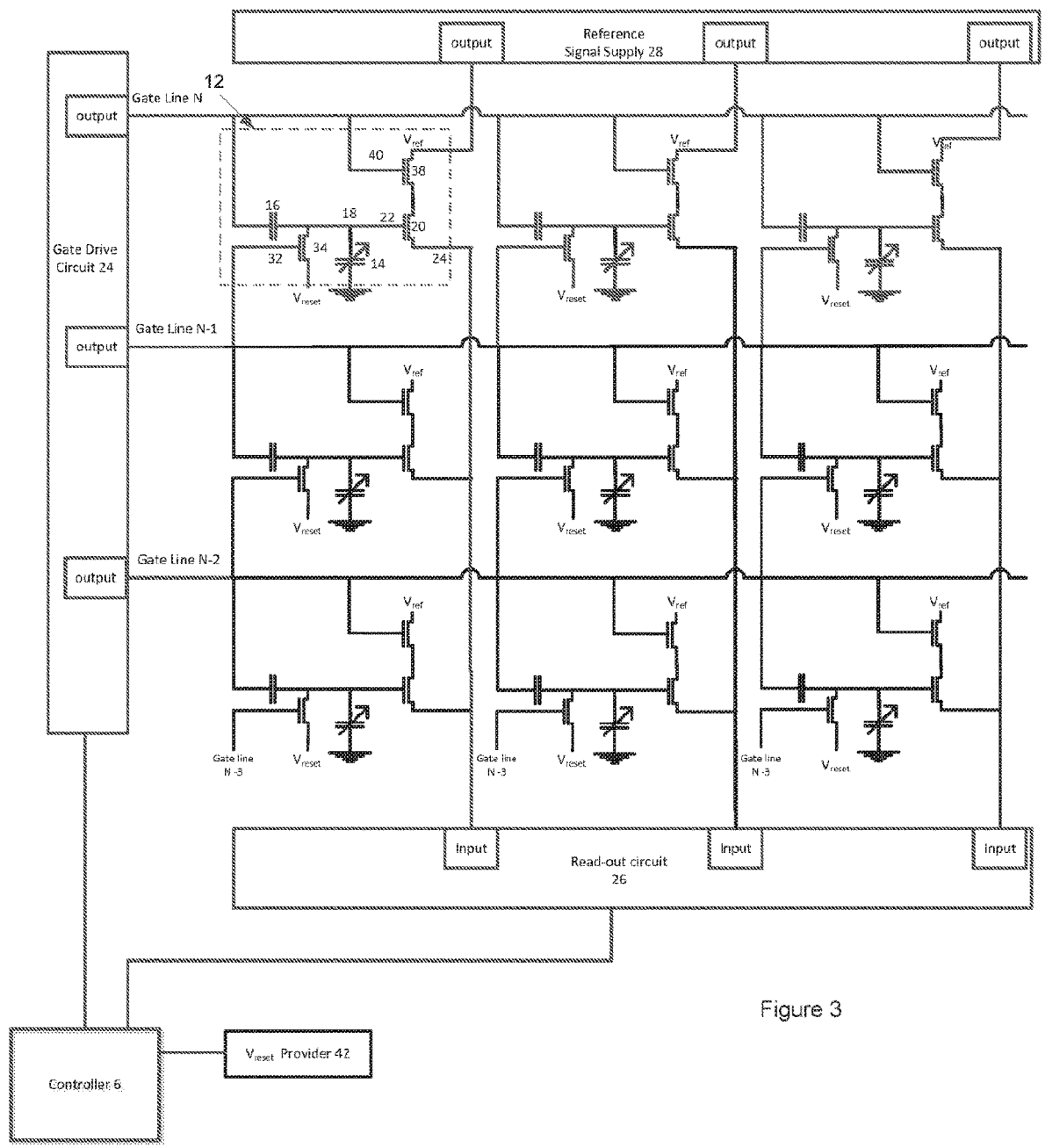
FIG. 3 shows a circuit diagram of another sensor array of the type shown in FIG. 1.

FIG. 3 illustrates another sensor array which may be used in the apparatus illustrated in FIG. 1.

FIG. 3 shows a sensor array 10 comprising a plurality of pixels, and a reference signal supply 28 for supplying a reference signal to the pixels. This can avoid the need for the gate drive power supply also to provide the current necessary for the read-out signal.

Also shown in FIG. 3 is the gate drive circuit 24, the read-out circuit 26, and the controller 6.

The sensor array 10 may also benefit from the inclusion of a reset circuit 32, 34 in each pixel. This may allow the control terminal 22 of the pixel to be pre-charged to a selected reset voltage whilst the pixel is inactive (e.g. while another row of the array is being activated by the application of a gate pulse to another, different, row of the array).

In these embodiments the sensor may also comprise a reset voltage provider 42 for providing a reset voltage to each of the pixels 12 of the array as described below. The reset voltage provider 42 may comprise voltage source circuitry, which may be configured to provide a controllable voltage, and may be connected to the controller 6 to enable the controller 6 to adjust and fix the reset voltage.

The reset voltage may be selected to tune the sensitivity of the pixel. In particular, the output current of the sense VCI 20 typically has a characteristic dependence on the indicator voltage at the control terminal 22 and its switch-on voltage. Thus the reset voltage may be chosen based on the switch-on voltage of the sense VCI 20. The characteristic may also comprise a linear region in which it may be preferable to operate.

The pixels illustrated in FIG. 3 are similar to those illustrated in FIG. 1 and FIG. 2 in that each comprise a capacitive sensing electrode 14, and a reference capacitor 16 connected with a capacitive sensing electrode 14. The connection between these two capacitances provides an indicator voltage, which can for example be connected to the control terminal 22 of a sense VCI 20. In addition, the pixels of the sensor array illustrated in FIG. 3 also comprise a further two VCIs 34, 38, and a connection to the reset voltage provider 42, and a connection to the reference signal supply 28.

As noted above, the sense VCI 20 is arranged substantially as described above with reference to FIG. 1, in that its control terminal 22 is connected to the connection between the reference capacitor 16 and the capacitive sensing electrode 14. However, the conduction path of the sense VCI 20 is connected differently in FIG. 3 than in FIG. 1. In particular, the conduction channel of the select VCI 38 connects the conduction channel of the sense VCI 20 to the reference signal supply 28 which provides a voltage $V_{ref}$. Thus, the conduction channel of the sense VCI 20 is connected in series between the conduction channel of the select VCI 38 and the input of the read-out circuit for the column. The select VCI 38 therefore acts as a switch that, when open, connects the sense VCI 20 between, $V_{ref}$, the reference signal supply 28 and the input of the read-out circuit and, when closed, disconnects the sense VCI from the reference signal supply 28. In the interests of clarity, the connection between the conduction channel of the select VCI and $V_{ref}$, the output of the reference signal supply 28 is shown only in the top row of the array of pixels. The connection reference signal supply 28 in the lower rows of the array is indicated in the drawing using the label $V_{ref}$.

The select VCI 38 is therefore operable to inhibit the provision of signal from any inactive pixel to the input of the read-out circuit 26. This can help to ensure that signal is only received from active pixels (e.g. those in the row to which the gate drive pulse is being applied).

In an embodiment each column of pixels is virtually connected to a ground or reference voltage. As such there may be no voltage differences on each of the columns thereby minimising parasitic capacitance. Furthermore, the reference signal supply may apply a current-drive rather than a voltage-drive which further reduces any effect parasitic capacitance could have on the signal applied by the active pixels on the inputs of the read-out circuit 26.

The gate drive channel for the pixel row is connected to the first plate of the reference capacitor 16, and to the control terminal of a select VCI 38. As in the pixel illustrated in FIG. 1, and FIG. 2, the connection to the reference capacitor 16 and capacitor sensing electrode 14 means that the gate drive voltage is divided between the reference capacitor 16 and the capacitive sensing electrode 14 to provide the indicator voltage which controls the sense VCI 20. The connection to the control terminal 40 of the select VCI 38 however means that, when the pixel is not active, the conduction path of the sense VCI 20 is disconnected from the reference signal supply 28.

A control terminal 22 of the sense VCI 20 is connected to the second plate of the reference capacitor 16. The conduction path of the sense VCI 20 connects the reference signal supply 28 to the input of the read-out circuit 26 for the pixel's column.

A conduction path of the reset VCI 34 is connected between the second plate of the reference capacitor 16 and a voltage output of the reset voltage provider, for receiving the reset voltage. The control terminal 32 of the reset VCI 34 is connected to a reset signal provider, such as the gate drive channel of another row of the sensor array. This can enable the reset VCI 34 to discharge the reference capacitor 16 during activation of another row of the array (e.g. a row of the array which is activated on the gate pulse prior to the pixel's row) or to pre-charge the control terminal 22 of the sense VCI 20 to the reset voltage.

Operation of the sensor array of FIG. 3 will now be described.

The gate drive circuit 24 and the read-out circuit 26 each receive a clock signal from the controller 6. In response to this clock signal, the gate drive circuit 24 activates a first gate drive channel of the gate drive circuit 24 to provide a gate pulse to a row of the array 10. A control voltage is thus applied to the control terminal of the select VCI 38 of the pixels in the first row (the active row during this gate pulse).

The control voltage is also applied to the control terminal of the reset VCI 34 of the pixels in a second row (inactive during this gate pulse).

In the first row (the active row), the conduction channel of the select VCI 38 is switched into a conducting state by the control voltage (e.g. that which is provided by the gate pulse). The conduction channel of the select VCI 38 thus connects the conduction channel of the sense VCI 20 to the reference signal supply 28.

The control voltage is also applied to the first plate of the reference capacitor 16. The relative division of voltage between the sensing electrode 14 and the reference capacitor 16 provides an indicator voltage at the connection between the reference capacitor 16 and the capacitive sensing electrode 14 as described above with reference to FIG. 1 and FIG. 2. The indicator voltage is applied to the control terminal 22 of the sense VCI 20 to control the impedance of the conduction channel of the sense VCI 20. Thus, the sense VCI 20 connects the reference signal supply 28 to the input channel of the read-out circuit 26 for that column, and presents an impedance between the two which indicates the capacitance of the capacitive sensing electrode 14. Please note, the reference signal supply may be provided by a constant voltage current supply.

A current is thus provided through the conduction path of the sense VCI 20 from the reference signal supply 28 to the input channel of the read-out circuit 26 for the pixel's column. This current is determined by the voltage of the reference signal supply and by the impedance of the conduction channel of the sense VCI.

In response to the same clock signal from the controller 6, the read-out circuit 26 senses the pixel output signal at each input channel (e.g. by integrating the current provided to each input channel), and digitises this signal. The integration time of the read-out circuit 26 may match the duration of the gate pulse.

Thus, in each clock cycle, the read-out 26 circuit obtains a set of digital signals, each signal corresponding to the signals sensed from each column of the active row during the gate pulse. The output from each pixel 12 in the row (each channel during that gate pulse) being indicative of the charge stored on the capacitive sensing electrode in that pixel.

In the second (inactive) row the control voltage is applied to the control terminal 32 of the reset VCI 34. This causes the reset VCI 34 of the pixels in the inactive row to connect the second plate of their reference capacitors 16 to a reset voltage provided by the reset voltage provider. This may discharge (e.g. at least partially remove) charge accumulated on the pixels of the inactive row, or it may charge them to the reset voltage, before they are next activated in a subsequent gate pulse. This reset voltage may be selected to tune the sensitivity of the pixels.

At the boundaries of the pixel array, where an N−1 gate line is not available, a dummy signal may be used to provide the control signal to the reset VCI. The gate drive circuit 24 may provide the dummy signal. This may be provided by a gate drive channel which is only connected to the rest VCIs of a row at the boundary of the array, but not to any sense or select VCIs.

As illustrated in FIG. 3, the reset VCI 34 of the pixels may be connected to the gate drive circuit so that each row is discharged in this way by the gate pulse which activates the immediately preceding row, which may be an adjacent row of the array.

Figure 4:
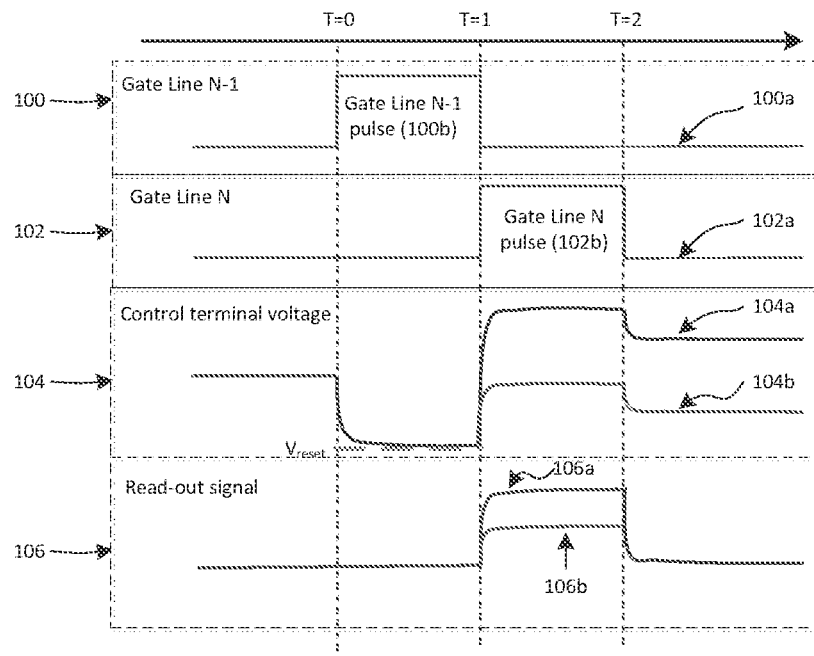
FIG. 4 shows a signal timing diagram for the operation of a pixel in a sensor array of the type shown in FIG. 3.

FIG. 4 shows a signal timing diagram for a pixel in row N of the sensor array of FIG. 3 in operation.

The signal timing diagram of FIG. 4 comprises four separate plots (100, 102, 104, 106) of signal values against a common time axis.

The first plot 100 is indicative of the control voltage 100a applied to gate line N−1 in response to gate pulse N−1 100b. The second plot 102 is indicative of the control voltage 102a applied to gate line N in response to gate pulse N 102b, the third plot 104 indicates the control terminal 22 voltage of a pixel sensing a conductive object at two different distances, (104a) and (104b) from capacitive sensing electrode 14, and the fourth lowermost plot 106 indicates the read-out signals (106a and 106b) from the pixel in of plot 104 applied to the input of the read-out circuit 26.

The time axis of FIG. 4 has three gradations $T_0$, $T_1$ and $T_2$ indicating different points in time. The interval between $T_0$ and $T_1$ indicates the duration of gate pulse N−1 and the interval between $T_1$ and $T_2$ indicates the duration of gate pulse N. The behaviour of the plots of FIG. 4 whilst the sensor array is in operation will now be discussed.

At $T_0$ a control voltage 100 produced in response to the gate pulse N−1 100b is applied from gate line N−1 to the control terminals of the reset VCIs 34 of the pixels in row N. This switches the reset VCIs 34 on and therefore a conduction path is opened through the reset VCIs 34 between the control terminals 22 of the sense VCIs 20 and the voltage output of the reset voltage provider. As a result, the reset voltage is applied to the control terminal 22 of the sense VCI 20 of the pixel as can be seen in the plots 104a and 104b between $T_0$ and $T_1$ of the voltage of the control terminal 22 of the sense VCI 20.

As mentioned in the description above the reset voltage may be selected to tune the sensitivity of the pixels in the array. In particular, the output current of the sense VCIs 20 typically have a characteristic dependence on the indicator voltage at the control terminal 22 and its switch on voltage. Thus the reset voltage may be chosen based on the switch on voltage of the sense VCI 20. The characteristic may also comprise a linear region in which it may be preferable to operate.

At T₁, after the gate pulse N−1 has finished 100b, a gate pulse N 102b from gate line N causes the gate drive circuit 24 to apply a control voltage 102a to the first electrodes of the reference capacitors 16 and to the control terminals 40 of the select VCIs 38 of the pixels in row N.

As a result of the application of the control voltage 102 to the control terminals 40 of the select VCIs 38 a conduction path is opened between the reference signal supply 28 and the sense VCIs 20 of the pixels of row N.

When a conductive surface is in sufficient proximity to the capacitive sensing electrode 14 of a pixel in row N, as is the case in FIG. 4, an indicator voltage 104a, dependent on the relative division of voltage between the sensing electrode 14 and the reference capacitor 16, is produced. The indicator voltage produced by the capacitive sensing electrode and reference capacitor is applied to the control terminal 22 of the sense VCI 20. A conduction path is thereby opened between the reference signal supply 28 and the read-out circuit 26.

As a result, signals such as those shown in 106 are applied to the corresponding input of the read-out circuit 26. The magnitude of the signal will depend on the proximity of the conductive surface.

The example shown in FIG. 4 overlays two signals (106a and 106b) generated by a conductive object positioned at two different distances from the capacitive sensing electrode 14 of a pixel.

The two different positions of the conductive object result in two different capacitances of the sensing electrode (e.g. because the dermis of the finger provides a second "plate" of a capacitor, the first "plate" of which is provided by the sensing electrode 14). The indicator voltages (104a and 104b) are applied to the control terminal 22 of the sense VCI 20 of the pixel. Therefore the impedance of the conduction path of the sense VCI 20 is different for the two positions of the conductive surface.

The signal applied to the input of the read-out circuit 26 is dependent on the impedance of the sense VCI 20 and is therefore different for the conductive surface at two different distances from the capacitive sensing electrode 14.

This is exemplified in the control terminal voltage signals 22 (104a and 104b) and read out signal profiles (106a and 106b) shown in FIG. 4.

At T₂ the gate line pulse N 102b finishes and the gate drive circuit ceases to apply a control voltage 102a to the pixels in row N. The control voltage 102 is no longer being applied to the control terminals of the select VCIs 38 and as a result the select VCIs of row N turn off.

The conduction paths through the select VCIs of the pixels in row N therefore close and a signal (106a and 106b) is no longer applied by the pixel to the input of the read-out circuit.

It can be seen that some residual charge on the sensing electrode may remain after the gate pulse for line N 102b has finished. It will be appreciated in the context of the present disclosure that the select VCI 38 may act to prevent such residual charge operating the sense VCI 20 and so giving rise to spurious signal from inactive rows.

Different pixel designs may be used in arrangements such as that described with reference to FIG. 3.

Figure 5:
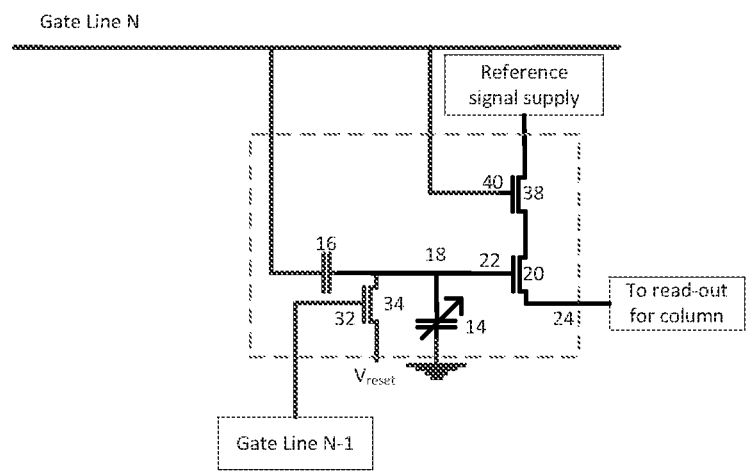
FIG. 5 shows a circuit diagram of a pixel for use in a sensor array such as that illustrated in FIG. 3.

FIG. 5 illustrates a circuit diagram of the sensor pixel 12 that is illustrated in the array of FIG. 3. The pixel 12 however is shown in isolation in the interests of clarity.

It can be seen that the pixel 12 comprises a reference capacitor 16, a capacitive sensing electrode 14, a sense VCI 20, a select VCI 38 and a reset VCI 34.

The pixel 12 of FIG. 5 is similar to that shown in FIG. 1 and described above, in that a connection between the reference capacitor 16 and the capacitive sensing electrode 14 provides an indictor voltage which may be connected to the control terminal of the sense VCI 20.

However, the pixel 12 of FIG. 5 differs from that of FIG. 1 in that it comprises a select VCI 38 and a reset VCI 34.

The conduction path of the select VCI 38 is connected between the conduction channel of the sense VCI 20 and a reference signal supply. Thus the sense VCI 20 is connected in series between the select VCI 38 and an input of a read-out circuit 26. A gate line input of the pixel is connected to the control terminal 40 of the select VCI 38.

The conduction path of the reset VCI 34 is connected between the second plate of the reference capacitor 16 and a reset voltage provider. The control terminal of the reset VCI 34 is connected to a reset signal provider input of the pixel, when the pixel is assembled into an array this may, for example, be a connection with a gate line of another row of pixels in the array.

Figure 6:
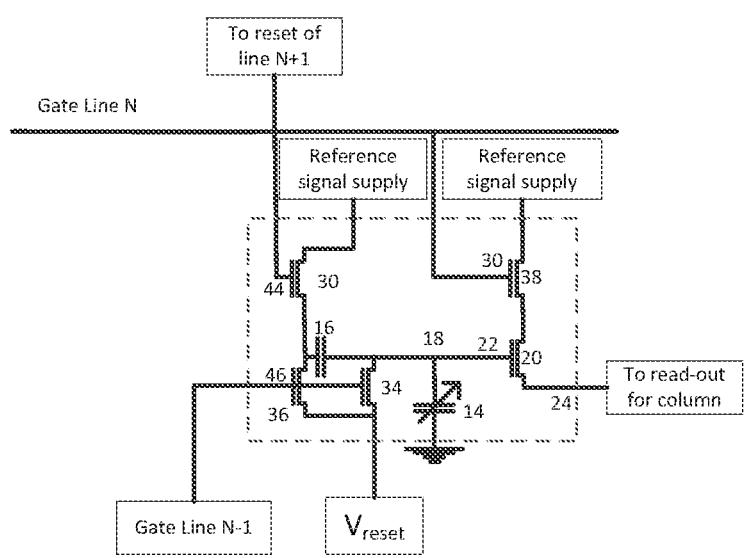
FIG. 6 shows a circuit diagram of another pixel for use in a sensor array such as that illustrated in FIG. 3.

FIG. 6 illustrates yet a further example of a pixel suitable for use in an array such as that illustrated in FIG. 3. This pixel is identical to that described in FIG. 4 other than in that it comprises a gate line VCI 30, and a second reset VCI 36.

The control terminal 44 of the gate line VCI 30 is connected to the gate drive channel for its row of the array. The conduction path of the gate line VCI 30 is connected between the reference signal supply 28 and a first plate of the reference capacitor 16. Thus, operation of the gate line VCI 30 by the gate drive circuit 24 can connect the series connection of the reference capacitor 16 and capacitive sensing electrode 14 to the reference signal supply 28. And, when the gate line VCI 30 is switched off the pixel disconnects from the reference signal supply 28.

In addition, the gate line signal need not supply the current to charge the array for readout.

As with the pixel of FIG. 5, the reset circuit of the pixel shown in FIG. 6 comprises the reset VCI 34 connected between the second plate of the reference capacitor 16 and a reset voltage provider 42, and also comprises a reset VCI 36 connected between the first plate of the reference capacitor 16 and the reset voltage provider. The control terminal 32 of the reset VCI 34 and the control terminal 46 of the reset VCI 36 are connected to a reset signal provider, such as the gate drive channel of another row of the sensor array as described above.

It will be appreciated in the context of the present disclosure that other reset circuits may be used. For example the conduction path of the reset VCI 34 may connect the first plate of the reference capacitor to its second plate (e.g. to short circuit the reference capacitor 16).

Operation of the pixel 12 shown in FIG. 6 in the array of FIG. 3 is similar to that of the operation of the pixel shown in FIG. 5 and described above. However in addition to operating the control terminal of the select VCI 38, the control voltage also operates the gate line VCI 30 to connect the first plate of the reference capacitor 16 to the reference signal supply 28. This reference signal is used to provide an indicator voltage at the connection between the reference capacitor 16 and the capacitive sensing electrode 14 as described above with reference to FIG. 1 and FIG. 2. The indicator voltage is applied to the control terminal of the sense VCI 20, to control the impedance of the conduction channel of the sense VCI 20, which when a control voltage is applied to select VCI 38 connects the reference signal supply 28 to the input channel of the read out circuit for that column.

In addition, in response to a reset signal from a reset signal provider (such as the gate drive channel of another row of the sensor array as described above) to the control terminals of the reset VCI 36 and reset VCI 34 a conduction path is opened between the reference capacitor 16 and the reset voltage provider. This causes the reset voltage to be applied to both electrodes of the reference capacitor 16 and thus the voltage across the reference capacitor 16 to be zero.

The reset voltage may be selected based on the thickness of the dielectric shield and/or the dielectric constant of the shield. For example, the reset voltage may be chosen to ensure that the range of capacitance changes associated with features of an object to be sensed (e.g. the contours of human skin) provide changes in indicator voltages from the capacitive potential divider 14, 16, that are sufficient to operate the sense VCI in a measurably different way. For example, the reset voltage may be chosen based on a threshold voltage of the sense VCI and based on the thickness of the dielectric shield and/or the dielectric constant of the shield so that the ridges and valleys of the contours of the skin both cause operation of the sense VCI in a linear region of its current voltage characteristic.

This may be desirable as the output current of the conduction path of the sense VCI 20 is dependent on the indicator voltage applied to the control terminal 22 and furthermore the change in the output current of the sense VCI 20 for a given change in control terminal voltage 22 is dependent on the value of the voltage applied to the control terminal 22.

It may be advantageous to set the reset voltage so that the control terminal 22 voltage of the sense VCI is in a voltage range where the VCI's output current varies linearly with control terminal 22 voltage. This is particularly true where the select VCI is present. It is also possible to select the reset voltage based on a threshold voltage of the sense VCI eg so that in a quiescent state, the sense VCI is at the threshold. The embodiments described herein typically comprise one or more voltage controlled impedance (VCI). Each such VCI has a control terminal, and a conduction path the impedance of which can be controlled by a voltage applied to its control terminal. Examples of voltage controlled impedances include transistors such as thin film transistors (TFTs). It will also be appreciated that when implemented into the sensor as a means of achieving voltage controlled impedances thin film transistors would act as transconduction gates wherein the output current ($I_{drain-source}$) of the TFT would be dependent on the voltage across the gate and source ($V_{gate-source}$) Of the TFT.

The dielectric shield may comprise a sheet or layer of insulating material such as glass or plastic. The insulating material of the dielectric shield described herein may be selected based on one or more of the following properties: surface roughness, transparency, chemical inertia, mechanical stiffness and robustness, dielectric constant; thermal behaviour and ease of manufacture. Suitable glass substrates include but are not limited to: Soda lime, borasilicate and $SiO_2$. Suitable polymer substrates include but are not limited to Poly Imide (PI), Polyethylene terephthalate (PET), polyethylene naphthalate (PEN).

It will be appreciated in the context of the present disclosure that the sensor apparatus may be designed to match certain timings.

The read-out of the pixel array performed by the read-out circuit may be executed on a frame basis, wherein each row of the pixels is read-out sequentially using a dedicated row time. Such that within a row time, all the corresponding pixels of that row are read-out.

Such a read-out is similar to TFT display technology. However the present case relates to pixel-reading of the sensor array rather than the pixel-writing of a TFT display.

The collection of all rows and related timing, may define the frame time of the sensor apparatus. For example a row time of 25 µsec, with a total of 100 rows, would result in a frame time of 2.5 msec i.e 25 µsec×100 msecs.

Other timings and read-out sequences may also be appropriate. For example in the case of multiplexer circuits, a multiple number of conversions may have to be executed within a single gate line time.

The embodiments disclosed herein describe the provision of a reset voltage to each of the pixels in the pixel array. The pixels in the pixel array may receive the same reset voltage wherein the reset voltage is chosen in the manner described previously.

It will be appreciated from the discussion above that the embodiments shown in the Figures are merely exemplary, and include features which may be generalised, removed or replaced as described herein and as set out in the claims. With reference to the drawings in general, it will be appreciated that schematic functional block diagrams are used to indicate functionality of systems and apparatus described herein. It will be appreciated however that the functionality need not be divided in this way, and should not be taken to imply any particular structure of hardware other than that described and claimed below. The function of one or more of the elements shown in the drawings may be further subdivided, and/or distributed throughout apparatus of the disclosure. In some embodiments the function of one or more elements shown in the drawings may be integrated into a single functional unit.

For example, the use of a controller to provide a clock signal has been mentioned. However, it will be appreciated in the context of the present disclosure that the controller may be part of the gate drive circuit and/or the gate pulse signal which is described herein may be used instead of the clock signal. For example, operation of the read-out circuit and the gate drive circuit may by synchronised using the gate pulses. For example the integration period of each input channel of the read out circuit may be controlled by the gate pulse.

In some examples the functionality of the controller may be provided by a general purpose processor, which may be configured to perform a method according to any one of those described herein. In some examples the controller may comprise digital logic, such as field programmable gate arrays, FPGA, application specific integrated circuits, ASIC, a digital signal processor, DSP, or by any other appropriate hardware. In some examples, one or more memory elements can store data and/or program instructions used to implement the operations described herein. Embodiments of the disclosure provide tangible, non-transitory storage media comprising program instructions operable to program a processor to perform any one or more of the methods described and/or claimed herein and/or to provide data processing apparatus as described and/or claimed herein. The controller may comprise an analogue control circuit which provides at least a part of this control functionality. An embodiment provides an analogue control circuit configured to perform any one or more of the control methods described herein.

The above embodiments are to be understood as illustrative examples. Further embodiments are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A sensor array comprising a plurality of touch sensitive pixels, each pixel comprising:
a capacitive sensing electrode for accumulating a charge in response to proximity of a conductive object to be sensed;
a reference capacitor connected in series with the capacitive sensing electrode so that, in response to a control voltage, an indicator voltage is provided at the connection between the reference capacitor and the capacitive sensing electrode to indicate the proximity of the conductive object to be sensed,
a sense voltage controlled impedance, VCI, having a control terminal connected so that a voltage at the control terminal corresponds to the indicator voltage so that the impedance of the sense VCI is controlled by the indicator voltage, and wherein a conduction path of the sense VCI is connected to a readout line for providing readout signals to a readout circuit;
wherein each pixel is configured to receive a gate drive signal to activate the sense VCI of said pixel to output a current to its readout line, wherein the current output to the readout line will depend on the voltage at the control terminal of the sense VCI; and
wherein each pixel comprises a reset circuit configured to set the control terminal of the sense VCI to a reset voltage prior to a gate drive signal being applied to said pixel, wherein the reset voltage is selected so that in response to the gate drive signal subsequently being applied to said pixel and a user's skin being in proximity to the capacitive sensing electrode of said pixel, a resulting voltage at the control terminal of the sense VCI will cause the sense VCI to operate in a linear region,
wherein the conduction path of the sense VCI is connected to a first plate of the reference capacitor, and the control terminal of the sense VCI is connected to a second plate of the reference capacitor.

2. The sensor array of claim 1 wherein a control terminal (32) of the reset circuit is connected to another pixel of the sensor for receiving a reset signal.

3. The sensor array of claim 1 wherein the reset voltage is provided by a reset voltage provider and is based on a thickness and/or dielectric constant of a dielectric touch shield of the sensor.

4. The sensor array of claim 1 wherein the conduction path of the sense VCI connects the first plate of the reference capacitor to an input of a readout circuit (26).

5. The sensor array of claim 1, wherein the voltage controlled impedances are constructed on a glass or polymer substrate, which substrate separates the capacitive sensing electrode from the object to be sensed.

6. The sensor of claim 1, wherein the reset voltage is selected so that in response to the gate drive signal subsequently being applied to said pixel and a ridge in a user's skin being in proximity to the capacitive sensing electrode of said pixel, a resulting voltage at the control terminal of the sense VCI will cause the sense VCI to operate in the linear region.

7. The sensor of claim 6, wherein the reset voltage is selected so that in response to the gate drive signal subsequently being applied to said pixel and a valley in a user's skin being in proximity to the capacitive sensing electrode of said pixel, a resulting voltage at the control terminal of the sense VCI will also cause the sense VCI to operate in said linear region.

8. A sensor array comprising a plurality of touch sensitive pixels, each pixel comprising:
a capacitive sensing electrode for accumulating a charge in response to proximity of a conductive object to be sensed;
a reference capacitor connected in series with the capacitive sensing electrode so that, in response to a control voltage, an indicator voltage is provided at the connection between the reference capacitor and the capacitive sensing electrode to indicate the proximity of the conductive object to be sensed;
a sense voltage controlled impedance, VCI, having a control terminal connected so that a voltage at the control terminal corresponds to the indicator voltage and so the impedance of the sense VCI is controlled by the indicator voltage, and wherein a conduction path of the sense VCI is connected to a readout line for providing readout signals to a readout circuit;
wherein each pixel is configured to receive a gate drive signal to activate the sense VCI of said pixel to output a current to its readout line, wherein the current output to the readout line will depend on the voltage at the control terminal of the sense VCI;
wherein each pixel comprises a reset circuit configured to set the control terminal of the sense VCI to a reset voltage prior to a gate drive signal being applied to said pixel, wherein the reset voltage is selected so that in response to the gate drive signal subsequently being applied to said pixel and a user's skin being in proximity to the capacitive sensing electrode of said pixel, a resulting voltage at the control terminal of the sense VCI will cause the sense VCI to operate in a linear region;
wherein the reset circuit comprises a reset VCI wherein a conduction path of the reset VCI is connected between a second plate of the reference capacitor and a first plate of the reference capacitor; and
wherein each pixel comprises a gate line VCI, and a conduction path of the gate line VCI connects the reference signal supply to the reference capacitor for providing the control voltage.

9. A sensor array comprising a plurality of touch sensitive pixels, each pixel comprising:
a capacitive sensing electrode for accumulating a charge in response to proximity of a conductive object to be sensed;
a reference capacitor connected in series with the capacitive sensing electrode so that, in response to a control voltage, an indicator voltage is provided at the connection between the reference capacitor and the capacitive sensing electrode to indicate the proximity of the conductive object to be sensed;
a sense voltage-controlled impedance, VCI, having a control terminal connected so that the impedance of the sense VCI is controlled by the indicator voltage, wherein a conduction path of the sense VCI is connected to a readout line for providing readout signals to a readout circuit;

a select VCI having a conduction path connected in series between the conduction path of the sense VCI and a reference signal supply;

a reset VCI having a conduction path which connects a reset voltage source to the control terminal of the sense VCI, wherein a control terminal of the select VCI is connected to a gate line for said pixel; and wherein a first plate of the reference capacitor is connected to said gate line for the pixel, and wherein a second plate of the reference capacitor is connected to each of: the conduction path of the reset VCI, the control terminal of the sense VCI, and the capacitive sensing electrode.

10. The sensor array of claim 9, wherein a control terminal of the reset VCI is connected to a different gate line to the gate line for said pixel.

* * * * *